(12) United States Patent
Asa

(10) Patent No.: US 7,243,439 B2
(45) Date of Patent: Jul. 17, 2007

(54) TOUCH SENSOR

(75) Inventor: Yukihiro Asa, Kodaira (JP)

(73) Assignee: ASA Electronics Industry Co., Ltd., Tokyo (JP)

( * ) Notice: Subject to any disclaimer, the term of this patent is extended or adjusted under 35 U.S.C. 154(b) by 29 days.

(21) Appl. No.: 10/510,612

(22) PCT Filed: Nov. 14, 2003

(86) PCT No.: PCT/JP03/14530

§ 371 (c)(1),
(2), (4) Date: May 23, 2005

(87) PCT Pub. No.: WO2004/048884

PCT Pub. Date: Jun. 10, 2004

(65) Prior Publication Data

US 2005/0231195 A1 Oct. 20, 2005

(30) Foreign Application Priority Data

Nov. 28, 2002 (JP) ............................... 2002-345112

(51) Int. Cl.
*G01B 3/00* (2006.01)
(52) U.S. Cl. ............................ 33/558; 33/551; 33/555; 33/561
(58) Field of Classification Search ............. 33/551, 33/553, 555, 558, 561, 559, 549, 536
See application file for complete search history.

(56) References Cited

U.S. PATENT DOCUMENTS 2,018,384 A * 10/1935 Schoof ....................... 33/551

(Continued)

FOREIGN PATENT DOCUMENTS

JP 60-119402 6/1985

(Continued)

*Primary Examiner*—Yaritza Guadalupe-McCall
*Assistant Examiner*—Travis Reis
(74) *Attorney, Agent, or Firm*—Michael A. Glenn; Glenn Patent Group

(57) ABSTRACT

A touch sensor using a Hall IC is provided. To this end, in a cantilever mechanism 15 of a parallel link by two plate springs 16, a coupling member 18 on the fixed side is fixed to a supporting block 24 which penetrates through the center of a plate spring 16 on a lower side and uprightly provided on a pedestal 22. A movable portion 28 on the free end side is a lightweight coupling member 19 provided by bend-processing an aluminum thin plate, to which a rare-earth magnet 25 is adhered. An elastic part 20*a* of a Hall IC supporting member 20 is fixed to the coupling member 18 on the fixed side, and a rigid part 20*b* with a rib 17*a* is supported by an adjusting rod 36 to fine-adjust relative position of a Hall IC 26 provided on the free end with respect to the magnet 25. Elastic wire materials 38*s* are fixed to the Hall IC supporting members 20*s* which hold at a free end 38*b* the self-weight of the movable portion 28, and abutted with a lower surface 40*a* of a bush on the inner surface of a housing 12, 50 that the movable portion 28 is stabilized in its position. A light load of 0.5 gf or less activates an anvil 34, and the Hall IC 26 detects a minute displacement of 0.1 mm or less of the magnet 25, in order to light up a signal light 14.

9 Claims, 6 Drawing Sheets

U.S. PATENT DOCUMENTS

| | | | |
|---|---|---|---|
| 2,047,408 A * | 7/1936 | Emery et al. | 33/558 |
| 2,627,119 A * | 2/1953 | Graham | 33/558 |
| 3,869,799 A * | 3/1975 | Neuer et al. | 33/561 |
| 3,987,551 A * | 10/1976 | Kienle | 33/558 |
| 4,703,261 A * | 10/1987 | Berchtold | 33/558 |
| 5,012,591 A * | 5/1991 | Asakawa | 33/558 |
| 5,154,002 A * | 10/1992 | Ulbrich | 33/558 |
| 5,623,766 A * | 4/1997 | Ruck et al. | 33/561 |
| 6,516,529 B2 * | 2/2003 | Hidaka et al. | 33/561 |
| 6,604,295 B2 * | 8/2003 | Nishimura et al. | 33/554 |
| 7,065,893 B2 * | 6/2006 | Kassai et al. | 33/554 |
| 7,076,883 B2 * | 7/2006 | Yamamoto et al. | 33/556 |
| 2004/0255703 A1 * | 12/2004 | Takai | 33/557 |

FOREIGN PATENT DOCUMENTS

| | | |
|---|---|---|
| JP | 62-040755 | 2/1987 |
| JP | 06-082238 | 3/1994 |
| JP | 10-172382 | 6/1998 |
| JP | 10-319075 | 12/1998 |
| JP | 2002-090103 | 3/2002 |

* cited by examiner

TOUCH SENSOR

FIELD OF THE INVENTION

The present invention relates to a touch sensor aiming to correct an error of process dimension due to abrasion of an edge tool by setting a reference position for checking the machining position while the cutting edge of the edge tool such as a bite and drill in an automated computer-controlled machine tool such as a machining center and a jig drilling machine advances. More specifically, the invention relates to a construction of a mechanism that enables it to detect a minute displacement (in microns or sub-microns) with a minute measuring pressure.

BACKGROUND ART

In recent years, IC integration level has increased dramatically. This requires further minute precision hole processing, for example, accurately depth-processing 2–4 layers out of 5–6 layers of printed boards in the order of micro-meter, using a drill made of an ultra-hard material such as diamond having a diameter in the order of 0.1 mm or less. The revolution speed of the drill reaches hundreds of thousands per minute, causing abrasion to occur at the cutting edge. Therefore, the edge position must be checked regularly, e.g. every one hundred times of hole processing, in order to keep the relative position between the working table and the cutting edge constant.

A touch sensor is used as a checking apparatus for keeping the cutting edge stable with respect to a reference position provided as a predetermined height from the surface of the working table of the aforementioned machine tool. It is provided with a mechanical means for switching an electric contact from ON state to OFF state by a snap action of, e.g. toggle mechanism, when a free end of a lever-type actuator rotatably supported by a hinge is pressed against an edge tool, and its movement is transferred to a sliding pin. Alternatively, it may be provided with an optical means wherein the reference position of the edge is detected with a signal output at which the edge directly blocks the light beam, to correct the fluctuation due to the abrasion at the edge.

However, a contact load for activating a touch sensor having a mechanical means requires e.g. 100 to 300 gf as an energizing force in order to counteract resistance by antiaction accompanied with a snap action of a contact by moving the actuator lever. Accordingly, without such a contact pressure, a setting of a reference position with accuracy and stable reproducibility is not obtained. On one band, processing a diameter of 0.1 mm or less in the order of 0.01 mm using a diamond drill requires a touch sensor with a very light contact pressure, because activating a touch sensor with a contact load as described above may cause the drill itself to bend at a buckle, resulting in unstable position setting of the drill tip, thereby damaging reproducibility.

On the other hand, detecting directly the tip of a cutting tool by an optical method involves no contact and does not require a setting pressure. But it has a disadvantage that it is difficult to respond to variations in the cutting edge form, because the method has so many adjusting parts for making adjustments, which depend on the characteristics of the electronic circuit, such as adjustments of reproducibility, neutral zone, light amount, and temperature change, so that it is inconvenient for handling and vulnerable to dust.

Therefore, an object of the invention is to provide a touch sensor having a contact load of 0.5 gf or less as an operation force, reproducing sensitivity or precision in the range of ±0.5 µm, freedom of attaching to and detaching from the working table of the automated machine tool, and furthermore ease of handling the reference position setting.

DISCLOSURE OF INVENTION

To achieve the object mentioned above, a touch sensor according to the invention is characterized by comprising, a first coupling member 18 constructed in a united manner with a pedestal 22, plate springs 16 arranged to be parallel to each other, one end sides of the plate springs being fixed to both ends of the first coupling member 18 respectively, a second coupling member 19 to couple other ends of the plate springs 16s to each other, a magnet installed in a manner that the side of each plate spring corresponds to the side of either magnetic pole, a pipe mounted to each plate springs 16 in parallel to the direction of the magnetic poles of the magnet 25, and a detecting means located near the magnetic pole boundary line of the magnet 25 and detects a displacement of the magnet 25 caused by an external force applied to the pipe 30, wherein the each plate 16 has a rigid part with rigidity on the base end side, and an elastic part with elasticity on the both end sides.

Furthermore, the touch sensor comprises elastic bodies 38s to cancel the effect of gravity on the second coupling member 19.

The touch sensor comprises, a supporting member 20 having one end side fixed to the first coupling member 18 and other end side provided with the detecting means 26 or the magnet 25, the supporting member 20 being inclined from the one end side to the other end side, and an adjusting member 36 for adjusting the distance between the supporting member 20 and the pedestal 22, wherein the magnet 25 or the detecting means 26 is mounted to the second coupling member 19.

Moreover, holes are provided to portions 16 and 19 where displacement is caused by an external force applied to the pipe.

One end of the pipe 30 is provided with a rigid anvil 34 to receive an external force.

The touch sensor comprises a notifying member for notifying whether or not a signal is output from the detecting means 26.

Pedestals 22 are provided to at least two parts on a bottom surface of the pedestal 22.

The pipe is provided with a regulating member 35 for regulating a displacement of pipe body 30.

Alternatively, the pipe 30 is provided so that its other end regulates a displacement of the pipe body 30.

That is, the touch sensor according to the invention uses a Hall IC to detect a minute displace of 0.1 mm or less of the small-size magnet which is displaced integrally with the parallel displacement of the anvil caused by a light load of 0.5 gf or less, so as to provide an open/close control of an electric circuit. The parallel displacement is basically provided by a parallel-link cantilever mechanism consisting of a dual structure by plate springs having the same shape, wherein, any of the plate spring is an empty frame having a rectangular shaped plan skeleton, polyimide thin plates forms a shape provided by elastic arms of a same length extended in a parallel manner in an elongated direction from each of the four corners of the skeleton, and an aluminum alloy thin plate with the same shape as the skeleton and a rib provided to protrude along the inner circumferential edge defining a rectangular space of the empty frame, is adhered to the skeleton so as to render the skeleton part a rigid body.

The coupling member for the plate springs on the fixed end side in the cantilever mechanism is fastened on the supporting block provided uprightly at the central part of the pedestal through the empty portion of the plate spring. The coupling member for the plate springs at the free end in the cantilever mechanism is formed in a U-shape by bend-processing an aluminum alloy thin plate, and it weight is decreased by boring holes. A tube material of a small diameter perpendicular to the plate springs penetrates the upper and lower surfaces of the U-shape and joins as a pipe with the surfaces. The small-size magnet is fastened to a predetermined position near the center of the coupling member at the free end, while opposed to the small-size magnet, a Hall IC is positioned to the free end of the supporting member provided and fixed to the coupling member on the fixed end side and extended.

In addition, an adjusting rod provided to the supporting block inhibits the supporting member from making an elastic deformation inclined from the fixing position to the pedestal, enabling to forcibly displace the Hall IC to a position where it is opposed to the small-size magnet, and enabling a fine-adjustment in the direction of the rod axis by means of the screw action of the adjusting rod. A signal light is provided and fixed to the supporting member.

There is provided with a molded housing totally surrounding the cantilever mechanism to form on the top surface of the pedestal a peripheral wall of a hermetical fitting stage for an inner surface of the bottom aperture of the molded housing. The molded housing is provided on the top surface with an aperture of a large diameter through which the pipe is inserted and a window having a transparent cover to render the signal light visible, and on the side surface with an opening through which an electric wire material is pulled out. At the forming surface for the large diameter aperture, a flanged boss facing the lock-washer is provided and fixed on the outside, and on the inside a bush to abut with and position the free end of the parallel link.

Furthermore, the anvil and the lock-washer are fastened to a tube material of a large diameter fitting the outer diameter of the tube material of a small diameter as the pipe, whereby the anvil is freely detachable from the pipe while the lock-washer regulates downward displacement of the pipe. As a positioning member for causing the free end of the parallel plate spring to abut with the bush, an elastic body is provided in a tensioned manner between the fixed and free ends of the parallel link in order to yield a force in the direction to cancel the effect of gravity acting on the construction at the free end, and thus restrain an inertia movement. The pedestal is provided with an extended part overhanging from the wall around the fitting stage to the exterior of the housing, and pedestals are drilled at at least two appropriate positions on the bottom surface.

According to the touch sensor of the invention, in order to set a reference height of the cutting edge from the working table surface, the anvil contacting with the cutting edge is subject to a parallel movement by means of the parallel link mechanism of the cantilever beams of the parallel plate springs made of polyimide thin plates. Furthermore, the movable portion of the parallel plate springs is made of aluminum alloy thin plates and a tube material with a small diameter, so that its weight is decreased. Thus, it is made possible to set the reference height using a contact load substantially of 0.3 gf or less, so that load is hardly applied to the edge tool.

With the Hall IC detecting the movement of the magnet caused by the parallel movement of the anvil, it is enabled to detect a displacement at a reproduction precision of ±0.5 μm or less to renew the default position setting the cutting edge. Further, the parallel plate spring has an empty skeleton through which space the supporting block at the fixed end of the cantilever beam is penetrated and constructed, and thus allowing a compact package of the total touch sensor. The movable portion of the parallel plate spring has its self-weight supported by a cantilever elastic wire material and abuts with the bush fixed inside the housing, which allows a compact construction as well as the movable portion of the parallel plate spring to be held stably.

Furthermore, since the elastically displaced position of the Hall IC supporting member is normally held by the adjusting rod, it is made possible to fine-adjust the relative position between the Hall IC and the magnet to a position indicating the optimal sensitivity, controlling the screw part of the adjusting rod renders. The anvil is freely detachable from the pipe, so that it can be easily replaced when abrasion or deformation occurs. Such a touch sensor can always be installed to a predetermined position on the working table by means of the knock hole drilled on the pedestal, it is made possible for an appropriate clamp to be engaged with and easily bolted to the extended part over-hanged to the exterior of the housing.

Further, it is possible to prevent the parallel plate springs from deforming excessively to a level exceeding an elastic limit, because the lock-washer fixed untidily to the anvil abuts with the flanged boss fixed to the top surface of the housing so as to limit the anvil movement, and the signal light enables the operation of the Hall IC visible. Moreover, no degradation due to abrasion will occur, because the magnet of the movable portion and the Hall IC of the detecting part are not in contact to each other, and since joints of the parallel link are the plate springs, there is no friction, i.e. no deterioration due to friction.

In those Figures, plate thicknesses are always exaggerated.

BEST MODE FOR CARRYING OUT THE INVENTION

Figure 1:
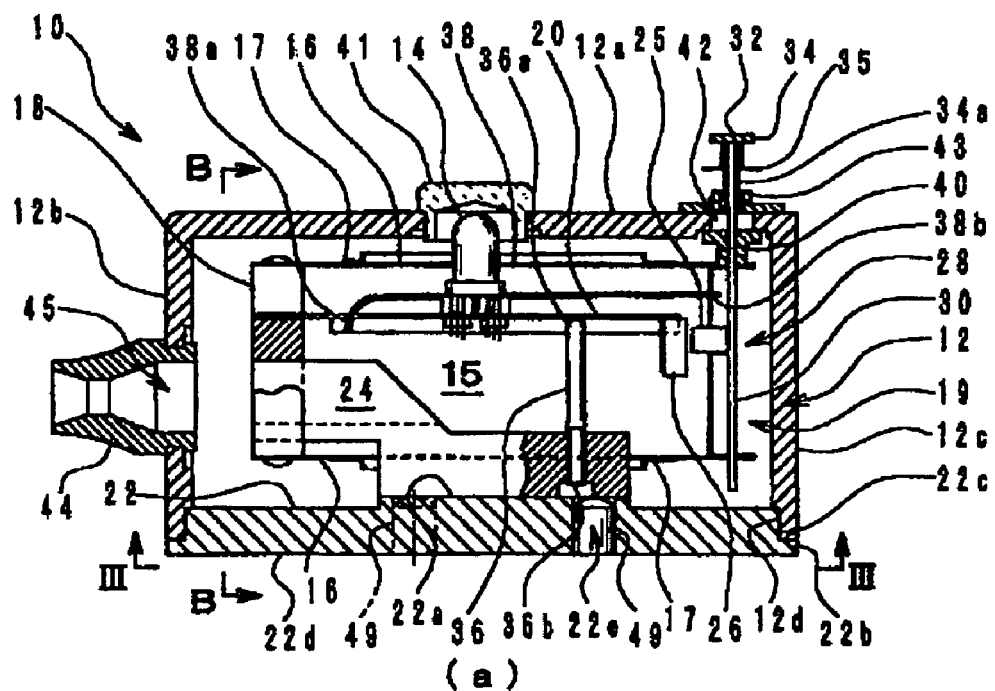
FIG. 1 illustrates an embodiment of a touch sensor according to the invention. FIGS. (a) and (b) respectively shows a side view and a cross section taken along line B—B of FIG. (a).
Figure 1:
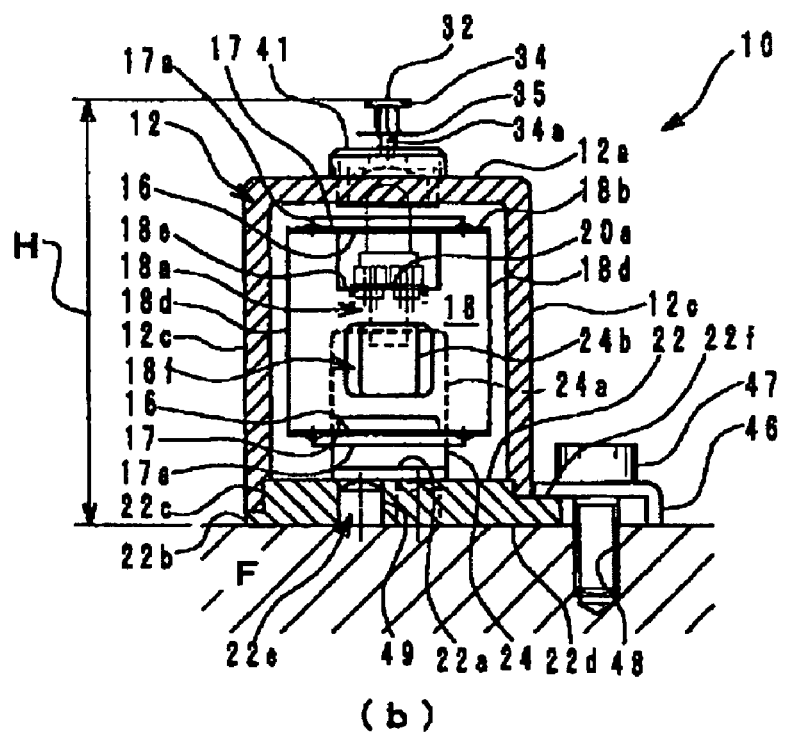
Figure 2:
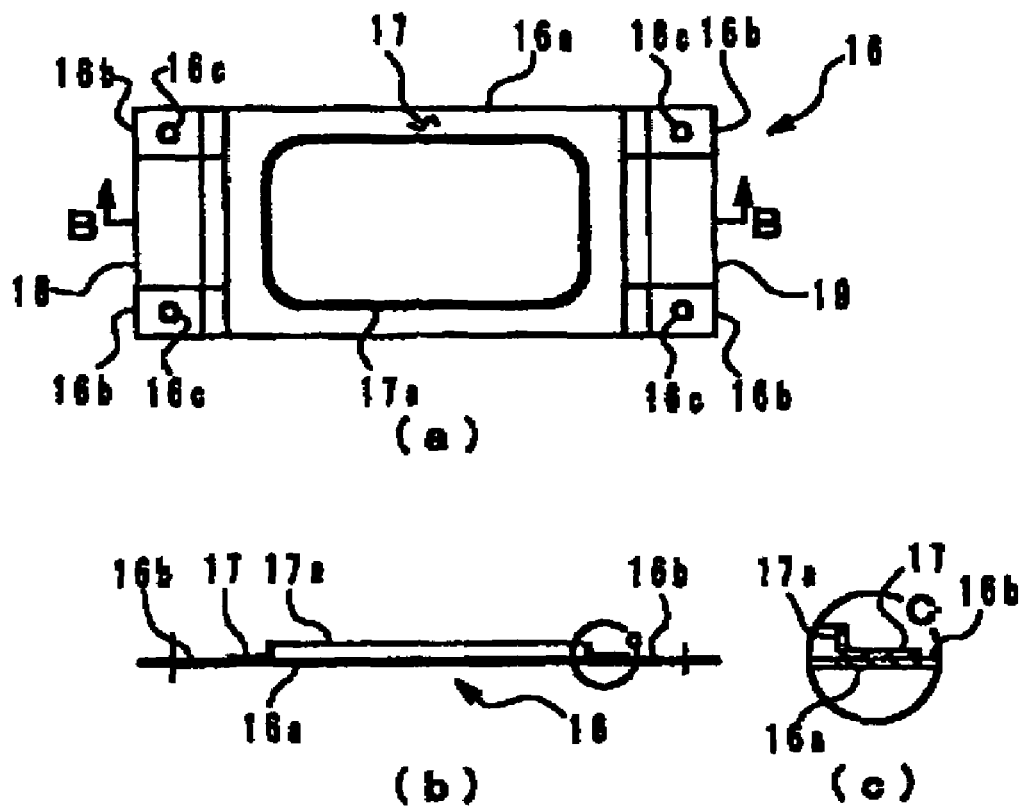
FIG. 2 is an illustration of a plate spring to construct a parallel link in the touch sensor according to the invention, (a) a plan view, (b) a cross section taken along line B—B of (a), and (c) an expanded view of the part of (b) circulated with a sign c attached to it.
Figure 3:
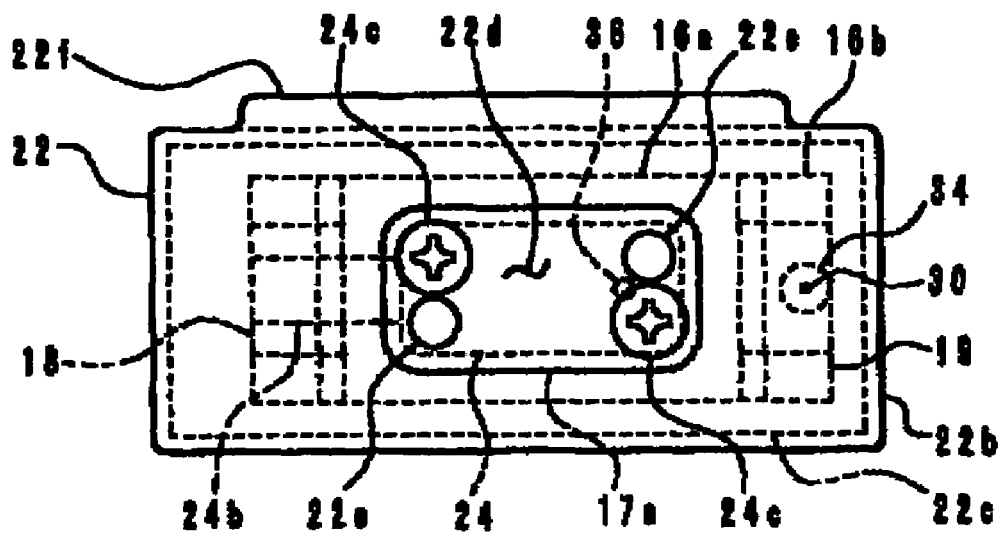
FIG. 3 is a bottom view taken along line III—III of FIG. 1(a).
Figure 4:
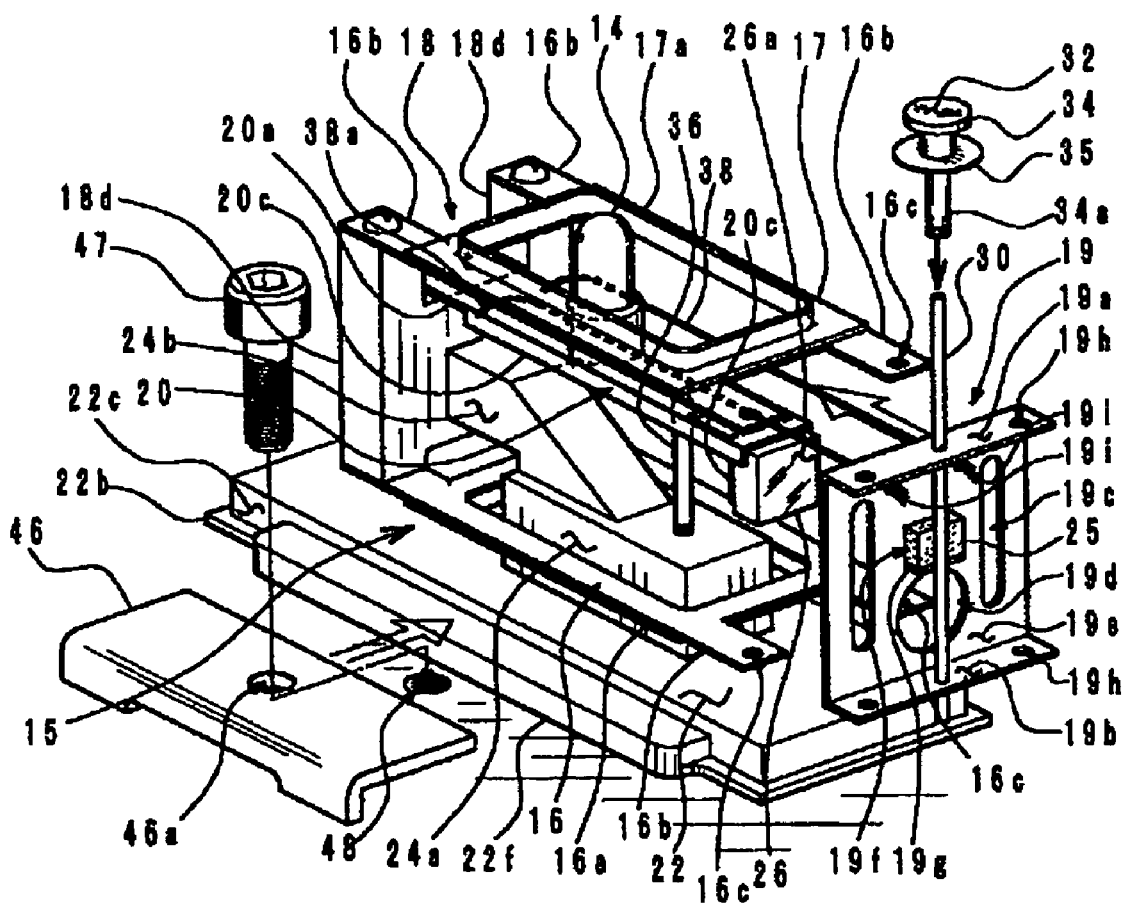
FIG. 4 is a perspective view of FIG. 1, parts thereof being disassembled.
Figure 5:
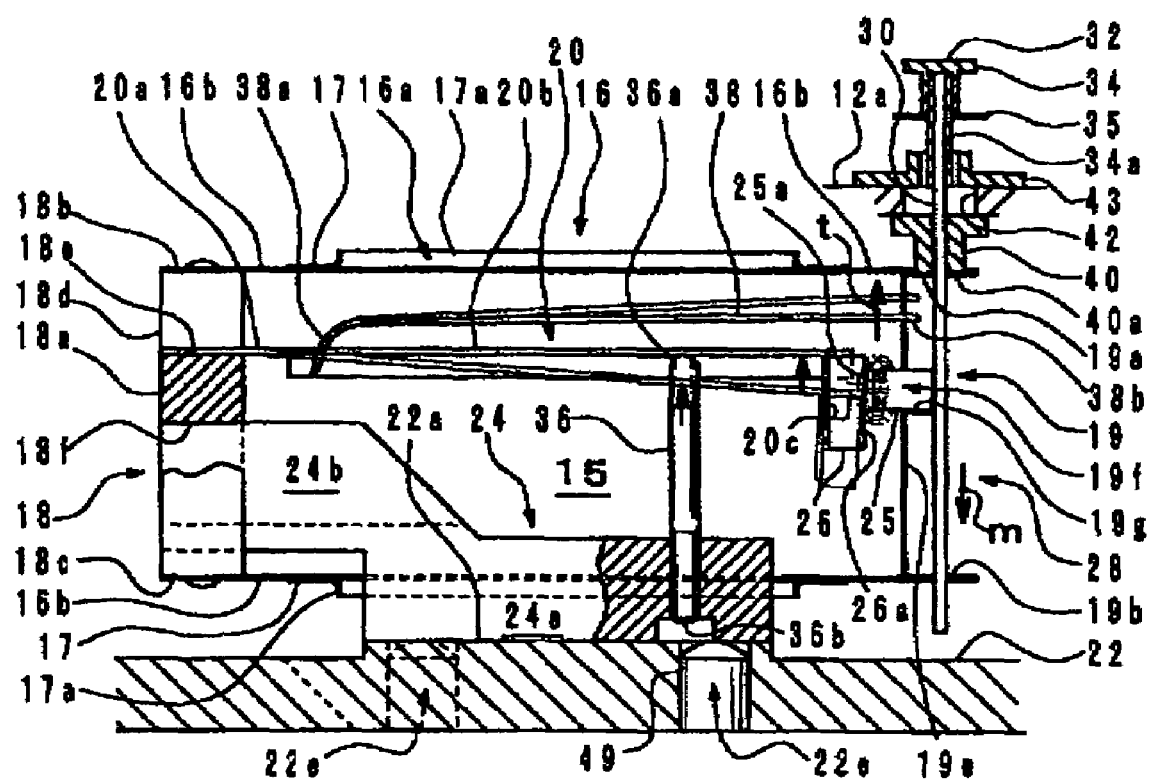
FIG. 5 is an operational illustration of a touch sensor in accordance with the invention, a housing and a signal light being removed.

A preferred embodiment of a touch sensor according to the invention will be now described in detail hereinafter based on the drawings. FIG. 1 shows an embodiment of a touch sensor 10 according to the invention, (a) a side cross-sectional view and (b) a cross-sectional view along line B—B of (a). FIG. 2 is a plan view to illustrate one of two parallel plate springs 16 of the same shape which are constructed mirror-symmetrically opposed to each other having a same geometry, (b) a cross-sectional view along line B—B of (a), and (c) an expanded view of the part of (b) circulated with a sigh c. FIG. 3 is a bottom view along line III—III of FIG. 1(a). FIG. 4 is a perspective view of FIG. 1, parts thereof being disassembled. FIG. 5 is an operational illustration of the touch sensor 10 of FIG. 1, a housing 12 and a signal light 14 being removed. Note that plate thicknesses are all exaggeratedly illustrated in the drawings.

In FIG. 1, a cantilever mechanism 15 which is a major member of the touch sensor 10 is a type of parallel link mechanism (see FIG. 6(b)) constructed by the two plate springs 16 having the same shape. As shown in a plan view in FIG. 2(a), a plate spring 16 is a formation of polyimide thin plate member (having a thickness of about 75 μm) shaped by a rectangular empty frame 16a, from four corners of which, elastic arms 16bs, elastic parts, are respectively extended in parallel in a longitudinal direction. Further, an aluminum alloy thin plate 17, a rigid part, is matched and adhered to each plate spring skeleton 16a (see FIG. 2(b) and (c)), the plate 17 being molded into an empty frame having the same plan shape as the skeleton 16a, and provided with a rib 17a cut and raised by burring along an inner circumferential edge so as to protrude from it. This turns the skeleton 16a of each plate spring 16 into a rigid structure, with only the part of each elastic arm 16b functioning as a movable portion. The thus constructed two plate springs 16, 16 having the same shape are spaced in parallel at an appropriate distance in upward, downward, and lateral directions, and opposed mirror-symmetrically to each other. The ends of the both springs are respectively combined by coupling members 18, 19 which are rigid bodies perpendicular to each plate spring 16.

Figure 6:
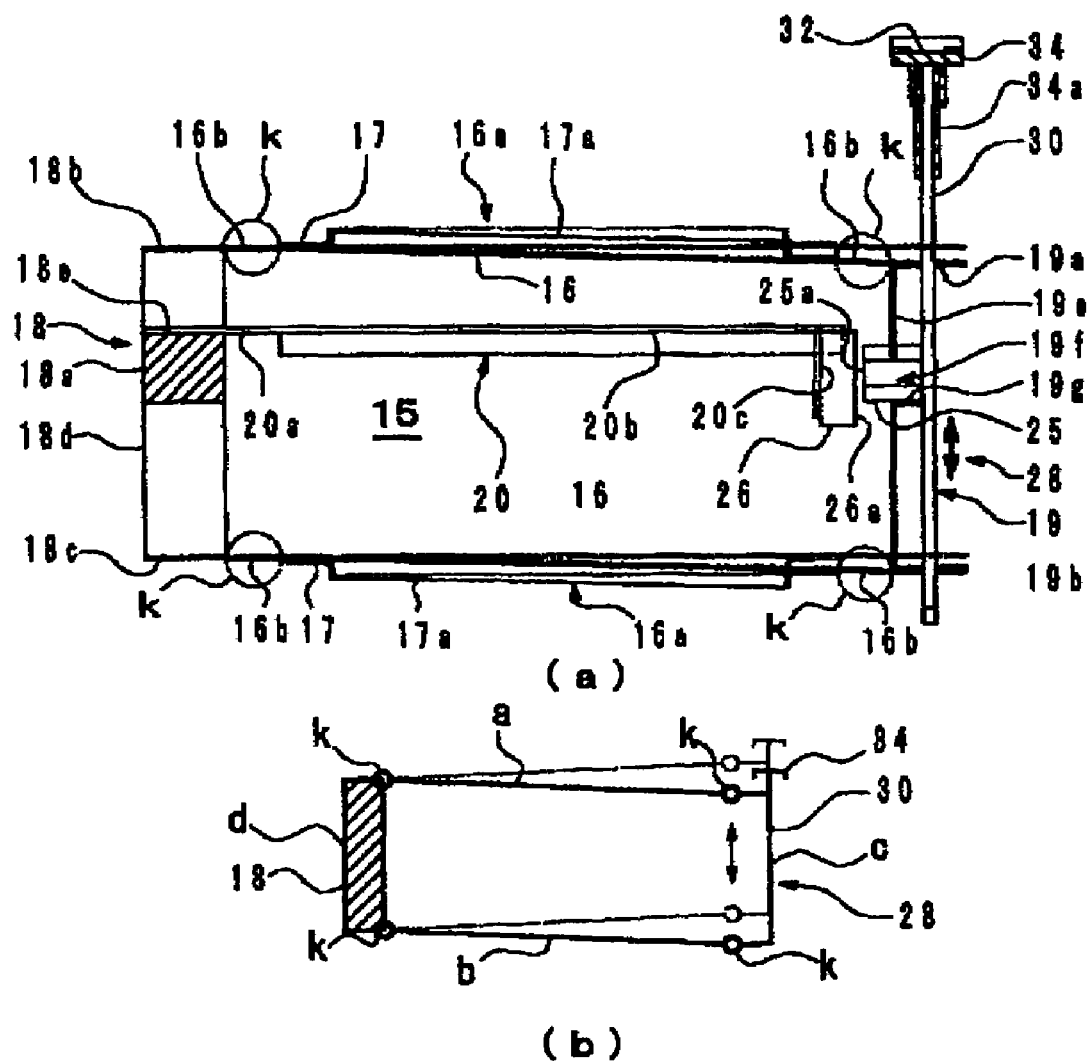
FIG. 6 is a descriptive view of a cantilever mechanism by two parallel plate springs in a touch sensor according to the invention, (a) being a partial view of an embodiment and (b) a schematic view.

In the cantilever mechanism 15 indicated in FIG. 6(a), the upward and downward displacements at free ends of the parallel plate springs 16, 16 are provided by curvature of four elastic arms 16b extended form the skeleton 16a. That is, the parallel link mechanism by four rigid bar bodies a, b, c, d shown in the schematic view of FIG. 6(b) is equivalent to one of FIG. 6(a), and a joint k in FIG. 6 corresponds to the elastic arm 16b circled by a two-dot chain line in FIG. 6(a). In the parallel link construction in FIG. 6(b), the upward and downward movement at a free end c causes rotational friction to occur between a shaft and a bearing that construct the joint k, while at the elastic arm 16b an elastic deformation absorbs the upward and downward movement and thus no friction occurs. Accordingly, neither load fluctuation due to friction, nor friction lose and abrasion will occur.

The coupling member 18 on the fixed end side of the parallel plate spring 16 in the cantilever mechanism 15 is advantageously a molded block of a ferrous material, considering expansion coefficient of the member having to be approximated to one of the processing machine to which the member is to be equipped for use. However, sleight of the coupling member 18 may be decreased using an aluminum alloy or a synthetic resin depending on purpose of use. The coupling member 18 on the fixed end side has two columns 18d, 18d extending from the both sides of a central pedestal 18a. Each of the columns has mounting surfaces on a top surface 18b and a lower surface 18c onto which the end of the elastic arm 16b of the parallel plate spring 16 is screw-combined and fixed. The two columns 18d, 18d are formed so that the extended portions above a seat surface 18e of the central pedestal 18a are sufficiently long. The seat surface 18e is provided as a mounting seat for a Hall IC supporting member 20 described hereinafter (see FIG. 1(b)).

A ferrous molded supporting block 24 is screw-combined from the lower surface and fixed to a mounting seat 22a provided to the top surface of the ferrous molded pedestal 22 to protrude from it, which is formed for the same reason as above (see FIGS. 1 and 3). As to the supporting block 24, as illustrated in FIG. 5, an upright portion 24a on the mounting seat 22a penetrates the rectangular empty space formed in the plate spring 16 positioned at the lower side, so that a transverse beam 24b extends in parallel with the mounting seat 22a through the middle position spaced apart from the both upper and lower parallel plate springs 16, 16. The transverse beam 24b intrudes into a penetration hole 18f provided by drilling the middle pedestal 18a of the coupling member 18 on the fired end side, so that the upper and lower surfaces 18b, 18c of the column 18d to be the fixing surfaces for the parallel plate springs 16s are provided and fixed to the mounting seat 22a in parallel. Under this condition, the free end of the cantilever mechanism 15 is elastically deformed to a position where the elasticity of the elastic arms 16b of the two upper and lower parallel plate springs 16 come to balance with the action of gravity m to be supported (see FIG. 6(a)).

As shown in the perspective view of FIG. 4, the coupling member 19 on the free end sides of the parallel plate springs 16 in the cantilever mechanism 15 is provided by outwardly bend-processing upper and lower parts of a lightweight aluminum alloy thin plate, and conjugating the parts to the free ends of the elastic arms 16b of each parallel plate spring 16. That is, forming U-shaped structure in section comprising two parallel upper and lower surfaces 19a, 19b provides the coupling member 19 on the free end sides with rigidity. Moreover, in order to decrease the weight, suitably shaped holes 19c, 19d are provided on a vertical surface 19e by drilling. On the vertical surface 19e, a pocket 19f is cut out to match the circumference of a small-size rare-earth magnet molded in a cube form 25 with its top surface side is provided as the South pole, the magnet 25 is adhered to a seat surface 19g provided by bending the lower hem at right angle to be cut and raised, and a surface 25a comprising South and North poles on the upper and lower sides respectively is opposed to a detecting surface 26a of the Hall IC 26 provided and fixed to the free end of the Hall IC supporting member 20 installed inside of the pocket 19f.

In the perspective view of FIG. 4, positioning is performed with pedestals 16cs provided by drilling the free ends of the elastic arms 16bs on the free end sides of the parallel plate springs 16s, and pedestals 19hs provided by drilling each of both ends of the top surface 19a and the lower surface 19b of the coupling member 19 at the free end side. The top surface 19a and the lower surface 19b of the coupling member 19 on the free end side are thereby adhered to the free ends of the elastic arms 16*bs* on the upper and lower free end sides. Thus, the free ends of the two upper and lower parallel plate springs 16 are coupled to the coupling member 19, so that a movable portion 28 of the cantilever mechanism 15 is formed.

A pipe 30 is adhered to the movable portion 28, the pipe 30 penetrating through the central part of the top surface 19*a* and the lower surface 19*b* of the coupling member 19 at the free end side, and being perpendicular to the mounting seat 22*a* of the molded pedestal 22. To lightweight the movable portion 28, the pipe 30 is preferably a thin stainless tube, and the coupling member 19 is lightweighted by providing holes inside. The upper end of the pipe 30 is long enough to protrude from the housing 12 described hereinafter, and relates to the setting of a reference height H from the working table surface F.

On the top surface of the pipe 30, an anvil 34 formed of pure aluminum on which surface highly rigid material such as sapphire, ruby and diamond is provided, is attachably/detachably provided to provide a flat contact surface 32 directly contacting with the cutting edge (not shown) of a measuring object and determining the reference height. That is, the anvil 34 is constructed such that it is adhered to a thin stainless tube rib 34*a* of a large diameter slidably fitting the outer diameter of the thin stainless tube forming the pipe 30, together with a lock-washer 35 functioning as a stopper. The lower end of the pipe 30 may be provides as a stopper to set a distance from the top surface of the molded pedestal 22 to limit the lower movement range of the movable portion 28.

As shown in FIG. 5, the Hall IC supporting member 20 comprises an elastic part 20*a* whose end part is fixed to the seat surface 18*e* of the pedestal 18*a* at the center of the coupling member on the fixed end side, a rigid part 20*b* forming a structure by bending downwardly the both lines along the longitudinal direction, and an adhering seat 20*c* of the a Hall IC 26 formed by bending downwardly the free end. The elastic part 20*a* is fixed to the seat surface 18*e* of the central pedestal 18*a*, with the rigid part 20*b* forcibly deformed and inclined downwardly by a snail angle (e.g. 40 degrees) as shown by the two-dot chain line in the drawing.

The slightly inclined rigid part 20*b* of the Hall IC supporting member 20 is supported at an upper end 36*a* of an adjusting rod 36 screwed to an appropriate position on the top surface of the supporting block upright portion 24*a*, and raised to an nearly horizontal position in order to move the Hall IC detecting surface 26*a* to an area that reacts to the flux of the magnet 25. The axially-directed upward and downward movement due to the screwing action of the adjusting rod 36 allows a fine adjustment of the optimal activating position of the Hall IC 26. By fixing the supporting block 24 to the pedestal 22 after the position adjustment of the Hall IC 26 is completed, the pedestal 22 conceals a head part 36*b* to control the axially-directed movement of the adjusting rod 36. This makes it impossible for the rod to be controlled externally, so that once the optimal position of the Hall IC26 is adjusted, it can not be intentionally modified. Additionally, as shown in FIGS. 1 and 4, the signal light 14 of a light emitting diode is provided and fixed to the Hall IC supporting member 20 so that it is possible to visualize an activating signal by lighting the signal light 14 which is emitted when the Hall IC 26 reacts to a magnetic potential of a preset threshold value.

Furthermore, as distinctly illustrated in FIGS. 4 and 5, two elastic wire materials 38*s* (stainless spring wire materials with a diameter of 0.1 mm, the natural shape thereof being illustrated with a two-dot chain line) to compensate the amount of downward natural displacement due to the weight m (arrow) of the movable portion 28 including the coupling member 19 the parallel plate spring 16, the magnet 25, the pipe 30, the anvil 34, and the lock-washer 35 in the cantilever mechanism 15, are provided and fixed to the Hall IC supporting member 20 by an end 38*a* in order to warp an free end 38*b*. The wire materials are inserted through two transparent holes 19*i*, 19*i* provided on the coupling member 19 corresponding to the extension lines of the elastic wire materials 38 right below the top surface 19*a* of the coupling member 19, so that an upward energizing force t (arrow) may be supplied. The imparting force t is much greater than weight m, and the top surface 19*a* of the coupling member 19 is lightly pressed against a lower surface 40*a* of a bush 40 provided and fixed to the inner surface of the housing 12. This renders it possible to hold the parallel plate springs 16 almost horizontally and stably, as well as stably set the position of the magnet 25 in the direction of the height.

Based on FIG. 1 again, the molded housing 12 totally surrounding the cantilever mechanism 15 will be described. Formed on a top surface 12*a* of the molded housing 12 are a window with a transparent cover 41 through which the signal light 14 is visible, and a large diameter aperture 42 through which the pipe 30 is position-adjustably inserted. A flanged boss 43 opposed to the lock-washer 35 mounted to the anvil 34 is adhered to the exterior of the large diameter aperture 42 to limit the range of downward movement of the anvil 34 by the lock-washer 35 and the boss 43*a* abutted to each other. To the inside of the large diameter aperture 42, the bush 40 is provided and fixed to loosely fit the pipe 30 to regulate the upper limit of the movement of the movable portion 28 or the magnet 25, so that the reference position of the anvil 34 is set.

An electric wire pullout opening 45 with a rubber cap 44 is provided on a sidewall 12*b* of the molded housing 12 facing the coupling member 18 on the fixed end side of the cantilever mechanism 15. Moreover, a sidewall circumference surface 12*c* of the side wall surrounding the molded housing 12 matches the same surface as the outer circumferential edge of the molded pedestal 22. Inside the outer circumferential edge 22*b* of the molded pedestal 22, a fitting stage peripheral wall 22*c* is formed to which a fitting inner surface 12*d* formed at the bottom aperture of the molded housing 12 is tightly fitted.

As shown in FIG. 3, on a lower surface 22*d* of the molded pedestal 22, a drilled hole for accommodating the head of a bolt 24*c* for bolting the molded supporting block 24 and a knock hole 22*e* for positioning are provided. Further, on a part of the outer circumferential edge 22*b* of the pedestal 22, an extended portion 22*f* is formed overhanging outwardly from the fitting stage peripheral wall 22*c* to the sidewall circumference surface 12*c* of the sidewall of the molded housing, and engaged with a clamp 46 as illustrated in FIGS. 1(*b*) and 4. A bolt 47 is inserted through a bolt hole 46*a* provided on the top surface, and screwed to a screw hole 48 carved on the working table surface F, so that the touch sensor 10 is fixed to the working table surface F.

Now, the touch sensor 10 according to the invention will be described with respect to its operation. Instead of a block gage for setting the reference height of the cutting edge of the drill, the touch sensor 10 is installed at an appropriate position on the working table F of a machine tool such as a computer-controlled machining center or jig drilling machine. To this end, a knock pin 49 is implanted and the screw hole 48 is carved at the installing position on the working table F so that the sensor can be installed at the same position all the time.

The knock hole 22e for positioning provided on the lower surface 22d of the molded pedestal 22 of the touch sensor 10 is engaged with the knock pin 49 implanted on the working table F. As shown in FIGS. 1 and 4, the clamp 46 is engaged with the extended part 22f of the molded pedestal 22 overhanging outwardly from the sidewall circumference surface 12c of the molded housing 12, and then the bolt 47 is inserted through the bolt hole 46a provided on the top surface of the clamp, to be screwed to the screw hole 48 on the working table F. By tightening the bolt 47, the working table F is pressed against the extended part 22f of the pedestal 22 by means of the clamp 46, so that the touch sensor 10 is fixed at the defined position.

The reference height H from the working table F to the top surface of the anvil 34 is automatically set. For example, in a precision hole processing, a drill (not shown) is moved from a processing position to a position right above the central axis of the anvil 34 of the touch sensor 10. When the drill is descended gradually, the tip of the drill come into contact with a contacting surface (reference surface) 32 of the anvil 34, so that the pipe 30 is downwardly pressed and moved. The weight of the movable portion 28 of the cantilever mechanism 15 is almost in balance with the integrated energizing force of the parallel plate springs 16 and the compensating elastic wire materials 38, allowing the load with which the cutting edge of the drill downwardly displaces the movable portion 28 via the anvil 34 to be provided as 0.5 gf or less. This dispels the concern that the drill may be buckling-deformed.

Figure 7:
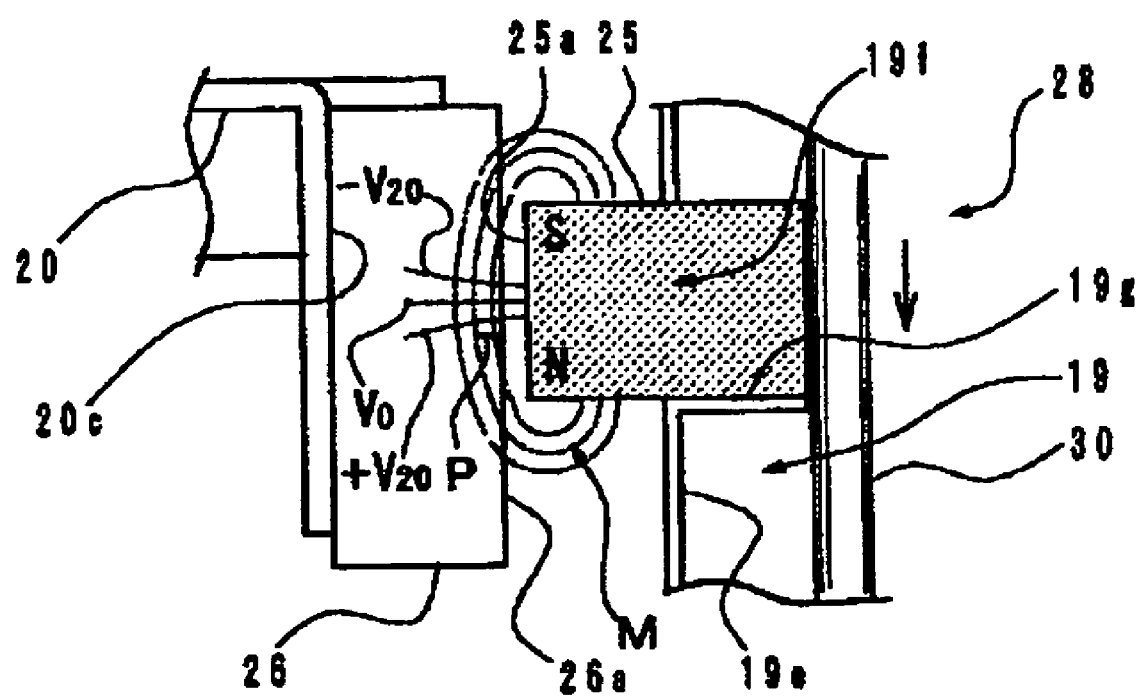
FIG. 7 is a side view of an expanded illustration of the relationship between a Hall IC and a magnet in a touch sensor according to the invention.

As illustrated expandedly in FIG. 7, the surface 25a of the magnet 25 provided and fixed to the coupling member 19 on the free end side constructing the movable portion 28, the surface 25a comprising the South and North poles on the upper and lower sides respectively, is opposed to the Hall IC detecting surface 26a at an adjacent position within the area of the magnetic field M of the magnet 25. The magnetic potential of the magnetic field formed by the magnet 25 is zero on a plane $V_o$ which crosses perpendicularly the axis of the magnet 25 at an equal distance from the both magnetic poles S, N. The magnetic power gradually strengthens toward the both poles. In the vicinity of the plane $V_o$, the effect of the magnetic force due to a fluctuation of distance between the SN surface 25a of the magnet and the Hall IC detecting surface 26a can be ignored, because the magnetic potential surface is distributed almost in parallel. Therefore, if the gap between the SN surface of the magnet 25a and the Hall IC detecting surface 26a is small enough, accurate fine adjustment is not required.

For this purpose, the threshold value of the Hall IC 26 to respond to the magnetic force is set to, for example, 20 gauss (S20 G) on the S-pole side, so that a Hall IC 26 transfers a closing signal to the connected electric circuit (not shown) at the moment the magnetic potential surface $-V_{20}$ such as of 20 gauss of the magnet 25 which descends together with the coupling member 19 united with the pipe 30 passes through, for example, a point P on the detecting surface 26a. Receiving this signal, the computer of the machine tool renews the initial setting of the reference position. On the other hand, receiving this signal, the signal light 14 of the emitting diode also lights up and blinks to notify that the cutting edge has reached the reference position. By this operation, it is rendered possible to monitor and correct the abrasion of the cutting edge all the time, an d to restrain the reproduction precision to ±0.5 μm or less with respect to the depth of the hole processing. The description of the electric circuit, which is known, is omitted.

An embodiment of the touch sensor according to the invention has been described above based on the drawings. However, the invention is not limited to the illustrated embodiment, and with respect to the shape, feature, etc, of the invention, alterations such as various modifications in details and re-construction of parts may expectedly be made within the scope of constituent features of the invention. For example, a drip proof function can be added by covering in a close-tight manner the gap between the lock-washer 35 provided integrally with the anvil 34 and the flanged boss 43, by means of a thin flexible rubber bellows. The elastic wire materials 38 to cancel the weight m of the movable portion 28 may be replaced with a tension coil spring, a compression coil spring, a spring wire, or a piano wire. These elastic wire materials may be of beryllium copper or phosphor bronze. The elastic wire materials 38 may be provided in such a manner that the plate spring 16 is suspended from the upper side or the plate spring 16 is pressed up from the lower side. Instead of comprising the elastic wire materials 38, the plate spring 16 may be installed to incline upwardly from the coupling member 18 to the coupling member 19, so that the self-weight of the plate spring 16, the coupling member, etc. will cause the plate spring 16 to be horizontal. Furthermore, a magnetically sensitive semiconductor such as a magneto resistance sensor may be employed instead of the Hall IC 26. As a material of the elastic arm 16c, a material having flexibility such as polyester and film-like metal may be employed instead of polyimide. Stainless, for example, may be employed as a material for the aluminum alloy plate 17, and the plate does not need to have a tabular shape. The installing positions of the magnet 25 and the Hall IC 26 may be mutually exchanged. In this case, it is preferred to provide the closing signal as a radio signal from the Hall IC 26, which can lightweight the coupling member 19. Also, in addition to or instead of lighting up the signal light 14 when the closing signal is received, other notifying means may be used to notify the reception of the closing signal, such as providing a speaker from which a sound may be output to indicate the reception of the closing signal.

INDUSTRIAL APPLICABILITY

The present invention may be used to check the machining position through which the cutting edge of an edge tool advances, such as a bite and drill in an automated computer-controlled machine tool such as a machining center and jig drilling machine.

The invention claimed is:

1. A touch sensor comprising,
   a first coupling member constructed in a united manner with a pedestal,
   plate springs arranged to be parallel each other,
   wherein each of one end of said plate springs is fixed to one end; of the first coupling member respectively,
   a second coupling member to couple other ends of the plate springs to each other,
   a magnet installed in a manner that the side of each plate spring corresponds to the side of either magnetic pole,
   a pipe mounted to each plate springs in parallel to the direction of the magnetic poles of the magnet, and
   a Hall IC located near the magnetic pole boundary line of the magnet for detecting a displacement of the magnet caused by an external force applied to the pipe,
   wherein the each plate has a rigid part with rigidity on the base end side, and an elastic part with elasticity on the other end.

2. A touch sensor as claimed in claim 1 characterized by comprising an elastic body to cancel the effect of gravity on the second coupling member.

3. A touch sensor as claimed in claim 1 or 2 characterized by comprising,
- a supporting member having one end side fixed to the first coupling member and other end side provided with the Hall IC or the magnet, the supporting member inclined from the one end side to the other end side, and
- an adjusting member for adjusting the distance between the supporting member and the pedestal,
- wherein the magnet or the Hall IC is mounted to the second coupling member.

4. A touch sensor as claimed in claim 1 or 2 characterized in that holes are provided to portions where displacement is caused by an external force applied to the pipe.

5. A touch sensor as claimed in claim 1 or 2 characterized in that one end of the pipe is provided with a rigid anvil to receive an external force.

6. A touch sensor as in claim 1 or 2 characterized by comprising a notifying member for notifying whether or not a signal is output from the Hall IC.

7. A touch sensor as claimed in claim 1 or 2 characterized in that feet are provided to at least two parts on a bottom surface of the pedestal.

8. A touch sensor as claimed in claim 1 or 2 characterized in that the pipe is provided with a regulating member for regulating a displacement of pipe body.

9. A touch sensor as claimed in claim 1 or 2 characterized in that one pipe end is regulated for displacement.

* * * * *